(12) United States Patent
Robillard et al.

(10) Patent No.: US 6,927,974 B2
(45) Date of Patent: Aug. 9, 2005

(54) SIMPLIFIED POWER AND DATA CONNECTOR FOR USE WITH CHASSIS SYSTEM THAT HOUSES MULTIPLE PROCESSORS

(75) Inventors: David Robillard, Moody, ME (US); Daniel Busby, Sterling, MA (US); Otto DeRuntz, Dunstable, MA (US); Mike Degerstrom, Rochester, MN (US); Richard M. Haney, Palo Alto, CA (US)

(73) Assignee: Egenera, Inc., Marlboro, MA (US)

( * ) Notice: Subject to any disclaimer, the term of this patent is extended or adjusted under 35 U.S.C. 154(b) by 0 days.

(21) Appl. No.: 10/283,702

(22) Filed: Oct. 30, 2002

(65) Prior Publication Data

US 2003/0081386 A1 May 1, 2003

Related U.S. Application Data

(60) Provisional application No. 60/341,061, filed on Oct. 30, 2001.

(51) Int. Cl.⁷ ................................................ H05K 5/20
(52) U.S. Cl. ........................ 361/686; 361/733; 361/724; 439/246
(58) Field of Search ................................. 439/247, 248, 439/701, 378, 246; 361/724–727, 784–789, 816.817, 796–803, 767, 768, 733, 686

(56) References Cited

U.S. PATENT DOCUMENTS

| | | | |
|---|---|---|---|
| 4,679,123 A | * | 7/1987 | Young ........................ 361/827 |
| 5,546,273 A | | 8/1996 | Harris |
| 5,638,895 A | | 6/1997 | Dodson |
| 6,027,345 A | * | 2/2000 | McHugh et al. .............. 439/66 |
| 6,202,291 B1 | * | 3/2001 | Toedtman .................... 29/739 |
| 6,243,265 B1 | | 6/2001 | Wong et al. |
| 6,325,636 B1 | | 12/2001 | Hipp et al. |
| 6,377,471 B1 | * | 4/2002 | Chong et al. ............... 361/796 |
| 6,421,215 B1 | | 7/2002 | Bushue |
| 6,493,319 B1 | | 12/2002 | Kramzrczyk et al. |
| 6,599,143 B1 | * | 7/2003 | Chong et al. ............... 439/247 |

* cited by examiner

Primary Examiner—Lynn Feild
Assistant Examiner—Anthony Q. Edwards
(74) Attorney, Agent, or Firm—Wilmer Cutler Pickering Hale and Dorr LLP

(57) ABSTRACT

The present invention provides chassis for housing at least one processor, the chassis includes at least one compartment adapted to receive a processor, a connector for coupling the at least one processor to the chassis when the processor is installed in the at least one compartment. The connector includes a first component attached to the processor and a second component attached to the chassis and adapted to be mated with the first component, the connector may also be adapted to provide data and power connections between the chassis and the processor when coupled. Additionally, the first component aligns and mates with the second component during the insertion of the processor into the compartment without any visual alignment of the first and second components of the connector.

3 Claims, 18 Drawing Sheets

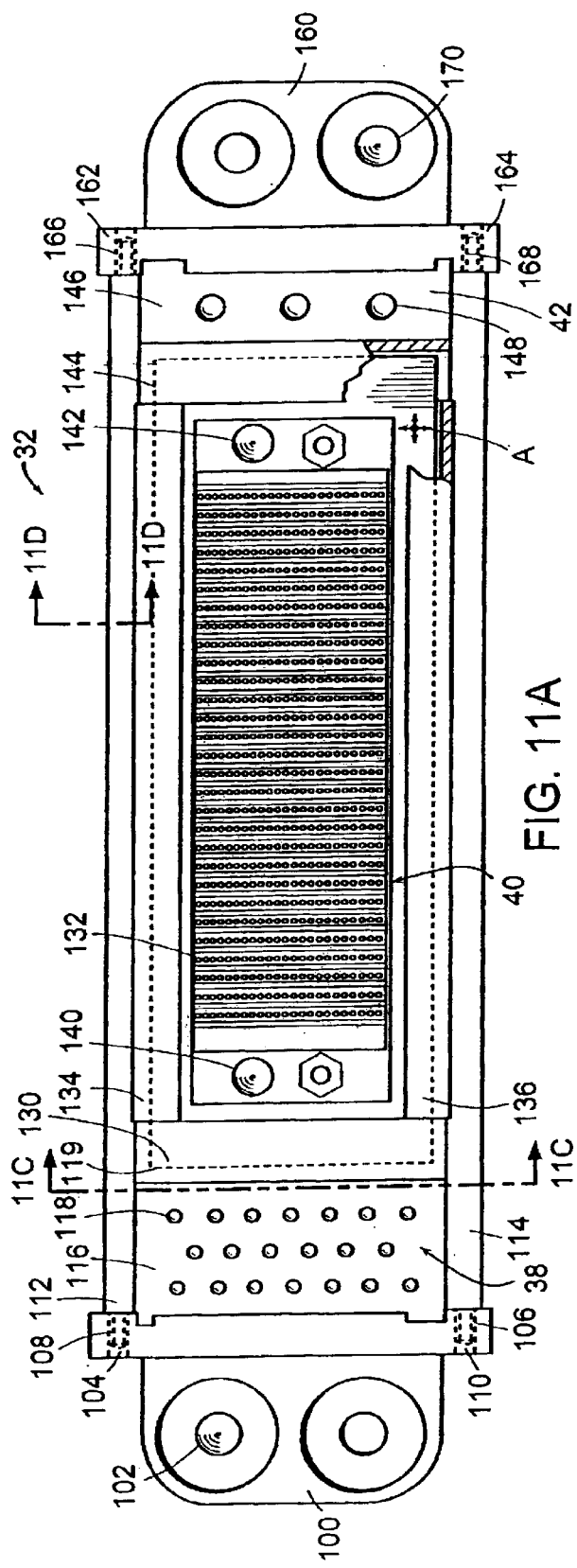
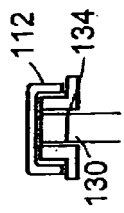
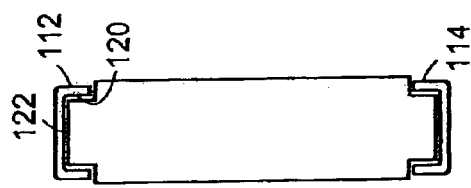
FIG. 11A
FIG. 11D
FIG. 11C

SIMPLIFIED POWER AND DATA CONNECTOR FOR USE WITH CHASSIS SYSTEM THAT HOUSES MULTIPLE PROCESSORS

BACKGROUND OF THE INVENTION

This invention relates to an information management system for network computers. More particularly the invention relates to a chassis which is adapted to receive multiple processors.

As the use of microprocessors in commercial enterprises has grown, systems have become more networked. A networked system can often require the interconnection of multiple processors, or servers. Typically the process interconnecting a computer system has required wiring several processors together. Then the connections required individual components of each processor to be attached to components of other processors.

A network "rack" system, for example, may have processors which can require multiple mouse, video, and keyboard connections, often one of each connection was required to accommodate the processors. Additionally, power is typically supplied to each component by an individual connector. Each rack of processors has multiple connection points of which could be the cause of failure and trouble-shooting faulty connections is time intensive because each cable and connection must be inspected.

Commonly, in current data systems, several "hosts" are connected to one another. Each host typically has its own management software, disk access, processor, keyboard, SCSI adapter, E-net interface, and power connection. Each host is connected to one another by a system of cables and systems management software. Also, as companies have started to utilize commercial services to handle some computer needs, such as a company's web site and as these activities are outsourced, have recognized the need within the computer industry to provide computer services into a remote location that meets the needs of many clients. The present invention addresses that need.

As networked computers and hosts increasingly are used there exists a need to provide a reliable, easy to use, chassis for housing processors and/or servers. Accordingly, the present invention provides a chassis for housing several processors with simplified connections between each processor. The system provides a modular approach to components so if one component fails, that component can be replaced without interfering or interrupting other components of the system. The invention will become apparent as the invention is described in the specification.

SUMMARY OF THE INVENTION

The present invention provides a chassis for housing at least one processor, the chassis includes at least one compartment adapted to receive a processor, a connector for coupling the at least one processor to the chassis when the processor is installed in the at least one compartment, said connector having a first component attached to the processor and a second component attached to the chassis and adapted to be mated with the first component, said connector adapted to provide data and power connections between the chassis and the processor when coupled. Additionally, the first component aligns and mates with the second component during the insertion of the processor into the compartment without any visual alignment of the first and second components of the connector.

Other aspects of the invention include a connector wherein the first component is a plug and the second component is a socket and the plug is fully installed in the socket when the processor is fully seated in the compartment. The chassis may include at least two compartments for housing processors and a second component is provided at each compartment, and a cable housing attached to the chassis that is adapted to contain cable, wherein said second component of the connector is attached to the cable housing, and the cable housing and second components can be removed from the chassis without removing the processors from the at least two compartments. The chassis of the present invention may have a second component of the at least one connector that is attached to the cable housing by a floating connector.

Other features of the invention include a chassis that has a connector and wherein the connector further comprises a high-speed data connection, a low speed data connection and an AC power connection, wherein each connection adapted to connect the chassis and the processor. In one embodiment of the invention, the connector may include a high speed fiber optic cable connector. Additionally, the connector may include fixed wiring on the sides opposite the plug and socket, or the sides opposite the plug and socket may be adapted to receive a connector plug of a power or data cable. These and other aspects of the invention will be come apparent in the Detailed Description of the Invention when read with the accompanying drawings.

BRIEF DESCRIPTION OF THE DRAWINGS

FIG. 11A is a face on view of connector plug with partial sectional that the high-speed data port connector is movable with respect to the other;

FIG. 11C is a sectional view taken from 11C—11C of FIG. 11A;

FIG. 11D is a sectional view from 11D—11D of FIG. 11A;

DETAILED DESCRIPTION

Figure 1:
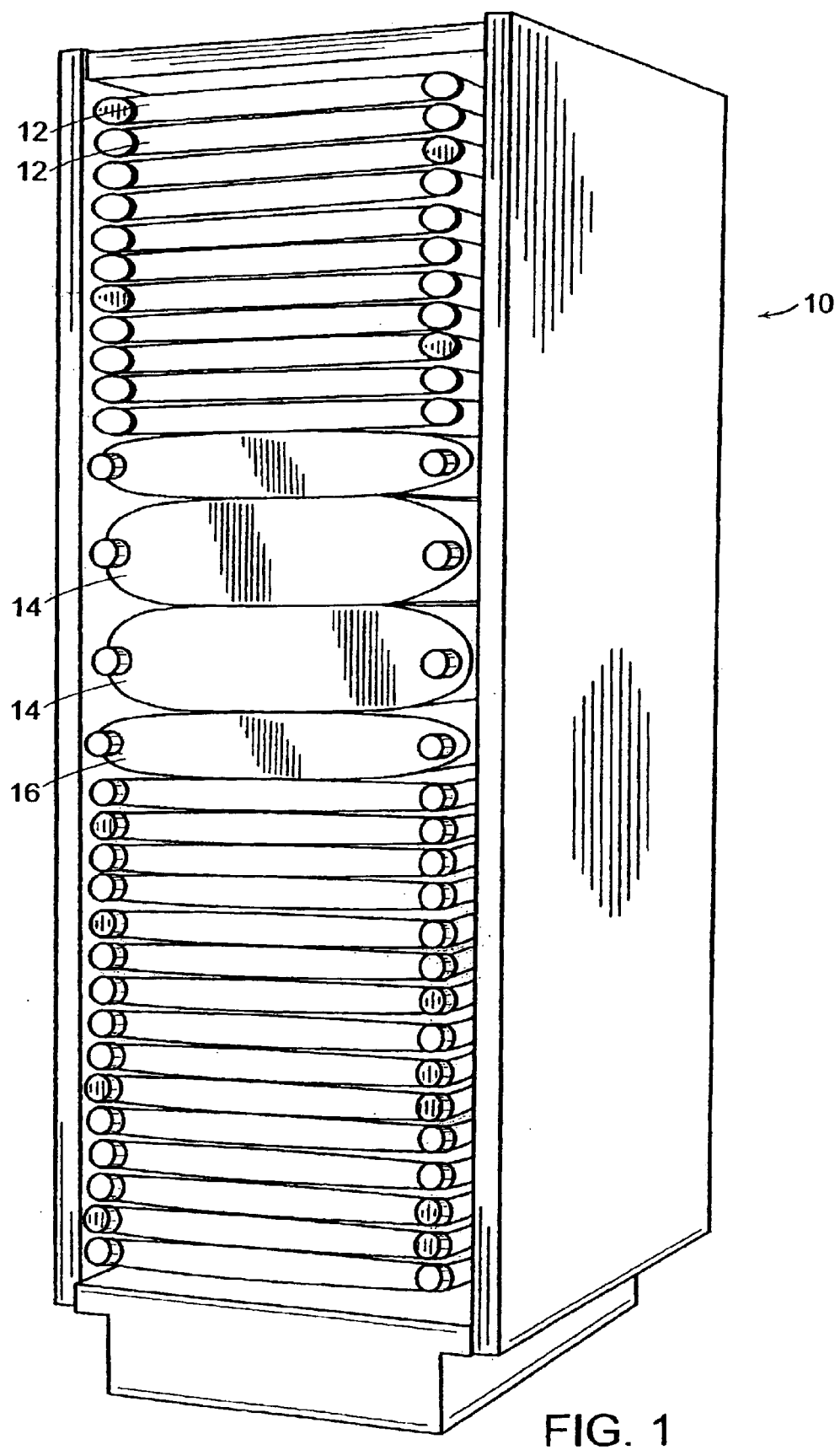
FIG. 1 is a perspective front view of the chassis with modular component processors and switch boxes installed.
Figure 2:
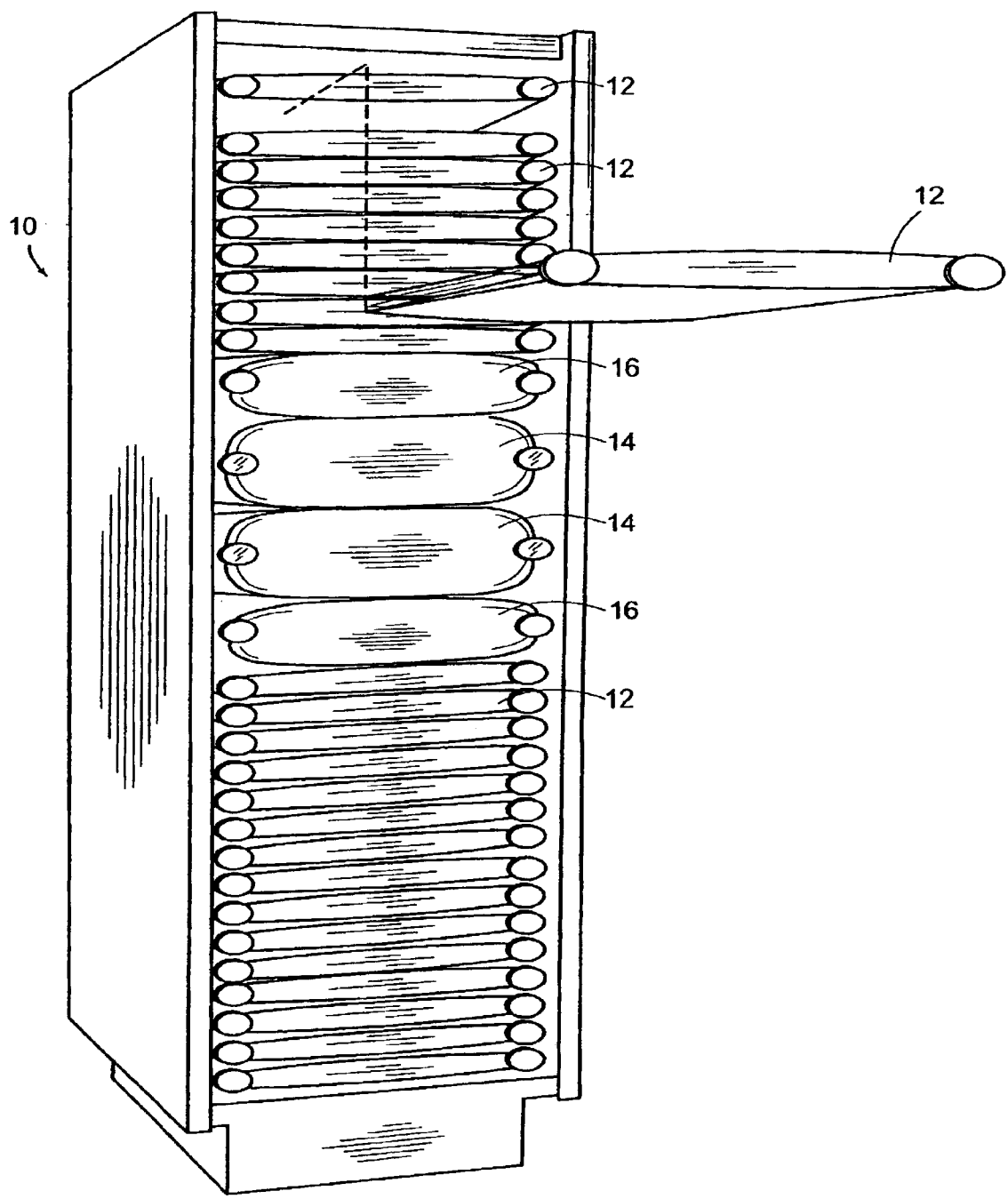
FIG. 2 is a perspective front view of the chassis with one modular component removed.

The present invention provides a chassis 10, shown in FIG. 1, which is adapted to house various components including multiple processors 12, two switch units 14, and two control unit 16 each which can be removed and replaced as shown in FIG. 2. Attached to the rear of the chassis is a cable housing 18 shown in FIG. 3. The cable housing contains all the cables required for each component and has a connector socket. The various components are attached to the cable housing by a connector 30. The connector includes a plug attached to each component and a socket attached to the cable housing and is described in detail with reference to FIG. 11A. The connector 30 is designed so that a component can removed and replaced without handling multiple connectors and the connection is designed to occur while inserting the component and not as a separate step independent of insertion. The cable housing contains the required cables for system operation as shown schematically at 20, and is designed to be replaced in a simple process. The cable housing 18 contains socket connectors 34, shown with phantom lines in FIG. 3 and detailed in FIGS. 9–14. Each aspect of the chassis system including the chassis, the cable housing, and the connector are described in detail below.

The Chassis

The chassis 10, a front view of which is shown in FIGS. 1 and 2 has a generally rectangular configuration which is about 2 feet by 2 feet and is approximately 84 inches tall. The chassis includes a weighted base to provide stability. The front of the chassis is open and is divided into 26 individual compartments for housing processors 12, two switch units 14, and two control units 16. The individual components are each removable and replaceable as shown in FIG. 2. When each component is fully installed, the exposed surface of the component is flush with the exterior of the housing. In the specification and throughout the figures, like reference numerals refer to the same elements. Where helpful, reference numerals have been indicated in various figures, even if the element is not specifically discussed in connection with the figure.

Figures 4, 5:
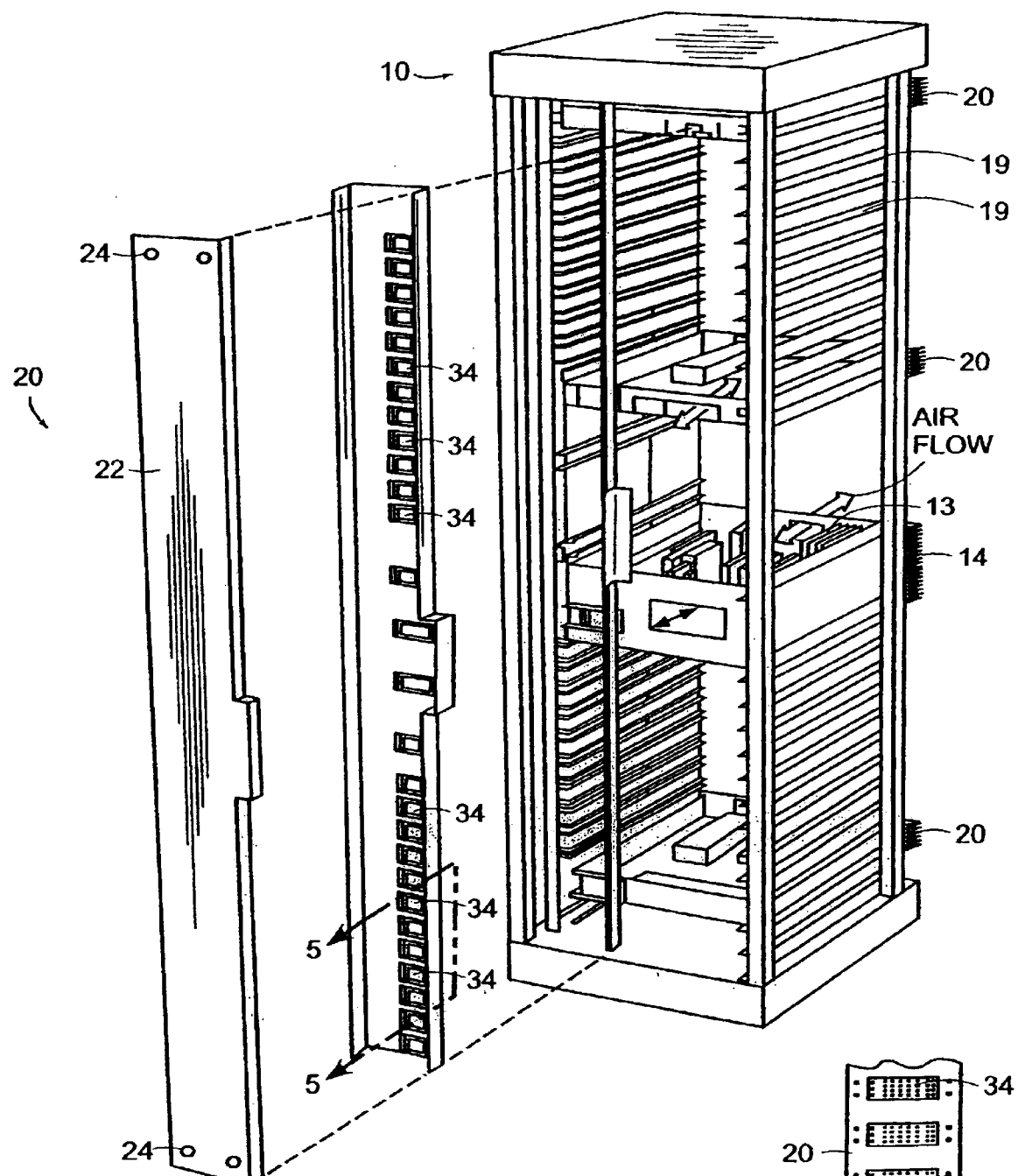
FIG. 4 is a perspective rear view of the chassis with the side covers removed and cable housing unassembled.
FIG. 5 is a detail view of Section 5—5 in FIG. 4.

The Applications Processors (AP) 12 provide the operating capacity for the chassis system. Each AP is constructed in an interchangeable, replaceable box, this is also known as "switchable". As shown in FIG. 4, and by way of example, they contain components 13 such as one or more Pentium III processors, each processor may contain 1.33 GHz Copper processor, or Foster processors. Four DIMM SDRAM slots may be provided and two high-speed serial ports are adapted to connect to the chassis. An AC power supply plug provides power for the AP processing capacity.

Since AC power is used for each processor, an AC cooling system can be provided for each AP so that each AP is individually cooled, e.g. with cooling fans. The airflow is shown schematically in FIG. 4. Each AP is designed to have front to back cooling. That is, a fan, shown as a box, will bring air from the front of the AP and cycle it over the components and out the back of the system. The chassis is compatible with air flow through the AP and allows the air to move outside the chassis. Thus the chassis system cooperates with the AP and provides the flow-through cooling for the system.

The IFC host processor 14 is a box approximately 6 inches tall and is designed to manage the system, and is shown schematically in FIG. 4. By way of example only, the host processor system may contain up to 4 Intel Pentium III XEON processors. Of course, more or fewer components can be used depending on the system requirements. The host processor also contains 16 DIMM SDRAM slots—8 GB of RAM, server works III HZ chip set, 2 SCSI 160 HDD ½ height, 7 PCI slots, a CD ROM with Read/Write capability and an AC Power supply. Like the AP, the cooling system is adapted to provide flow-through cooling.

The High Speed Serial Switch Module 16 is about 4 inches high and contains 32 High-Speed serial ports for AP to IFP communications. Like the other processors, an AC power supply provides necessary power to the system. Also, like the other systems the unity is configured for front to back flow-through air cooling.

The system is designed with redundancies so that if one part fails to operate, another redundant component is configured to operate while the inoperative component is being evaluated. Thus there are two host processors 14 and two interconnect modules 16.

The chassis system is adapted to contain each processor 12, 14, and 16 inside the housing. As shown when the processor is fully seated in the housing, the exterior of the module is flush with the front surface of the chassis. Of course other configurations are possible, including inset components protruding components, or a combination. The system provides for an integrated look and in some applications, multiple chassis may be deployed together and connected together to provide expanded computer networking capabilities.

Each module is adapted to slide on rails so that the installation and removal of the module from the chassis is smooth and consistent. Each module is insertable on rails 19, shown schematically in FIG. 4. The rails themselves are designed to allow for slight variations in the width of each module. While the rails are preferable, other means of positioning the components may be used.

Spine—Cable Housing

Figure 3:
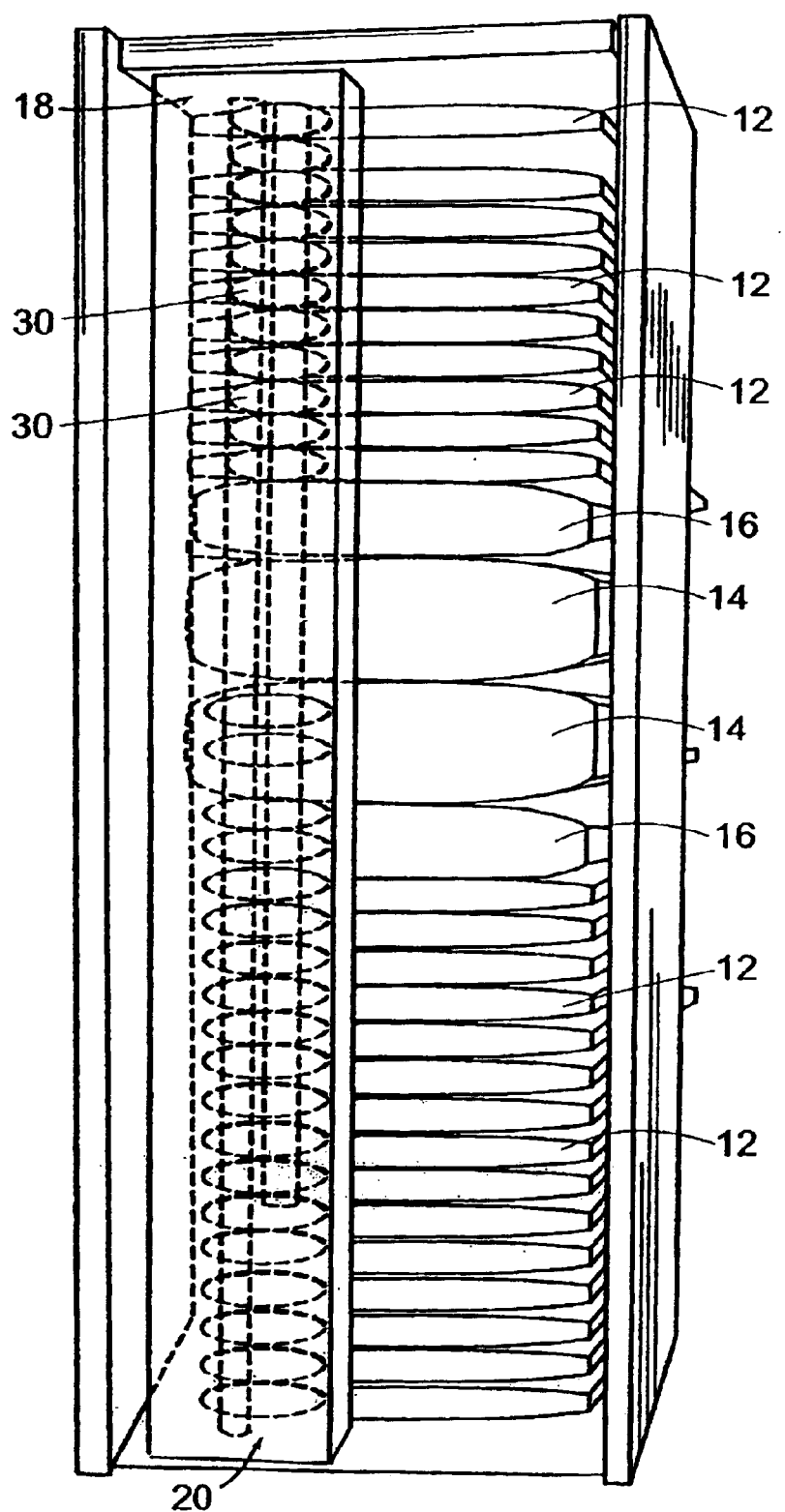
FIG. 3 is a perspective rear view of the chassis showing the cable housing with the location of the connector sockets shown in phantom.

FIG. 3 shows the cable housing 20, which is attached to the back of the chassis. The cable housing, shown with additional detail in FIGS. 4–8 houses the cables which connect the various components of the system. The cable housing 20 has a cover 22 and is designed to be modular and is fastened to the housing with 4 screw fasteners. If it becomes necessary to replace the cable housing, the units can be removed from the housing by removing the 4 fasteners 24. The cable housings of prior art devices were precision fit and, if a single cable was inoperative, the entire cable housing could only get replaced by a precision assembly device which aligned various components of the system. Thus replacement, when possible, required extensive work and was time-consuming. The cable housing of the present invention needs no precision alignment tools because each individual connector components is adapted to be reliably attached to its mating component even with slight misalignment.

The cable housing of the present invention provides a compact assembly that contains the cable and provides the support on which is mounted the socket side of the connector that connects the components 12, 14, and 16 to the housing. The connector is shown in phantom in FIG. 3 and is described in more detail below. As shown in FIG. 5, the connector socket is attached to the cable housing so that the socket holes face the interior of the chassis. Cables are attached to the opposite side of the connector and connect the various components. The connector is mounted to the cable housing using a "floating" connector which allows for amount of movement. In other words, the connector is allowed to move a certain amount to facilitate alignment during the connection process.

Figure 6:
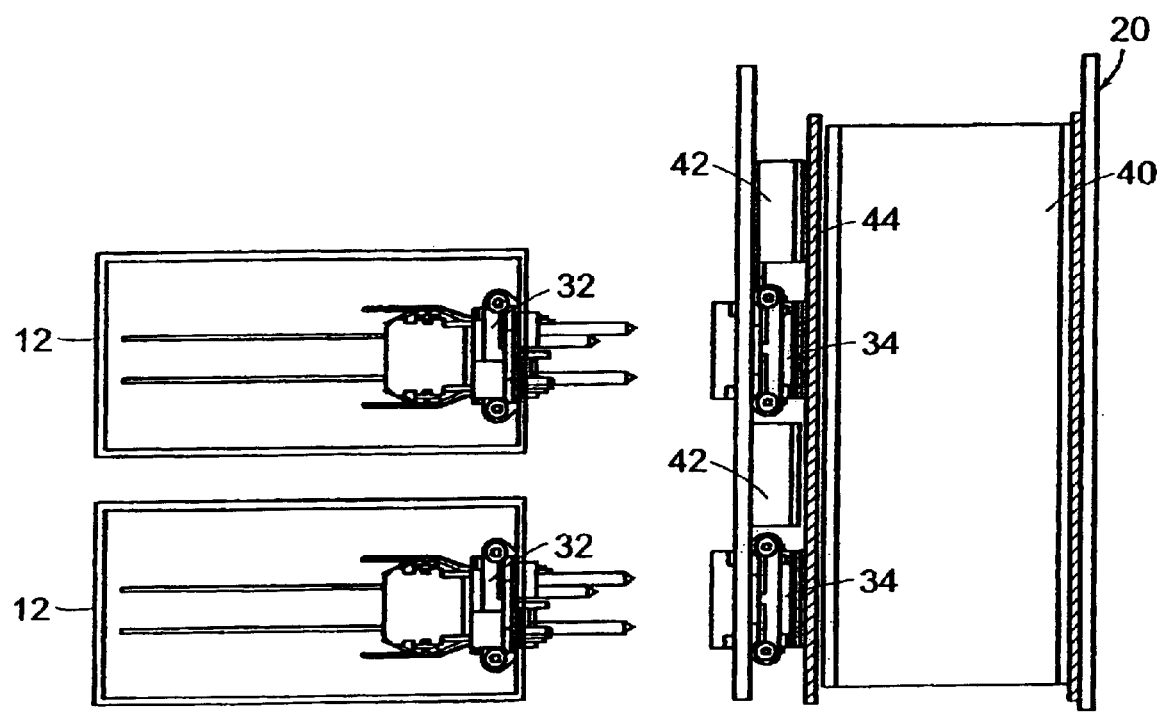
FIG. 6 is a detail view of the spine with EMI shield and connectors.
Figure 7:
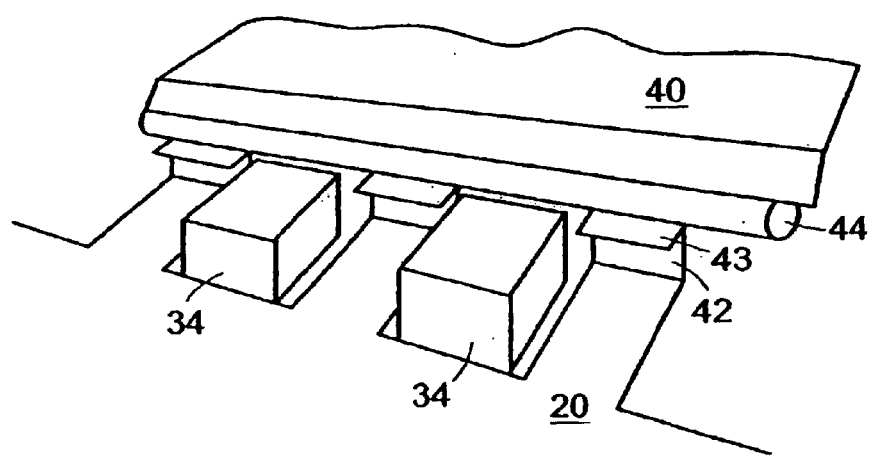
FIG. 7 is a detail view of the EMI shield in the spine.

The AC Power connection and wires are isolated from the data lines by an Electro Magnetic Interference (EMI) barrier or shield 40. FIG. 6 shows the connector including a plug 32 and a socket 34 attached to the processors and spine, respectively. The EMI barrier extends the length of the spine. As shown in FIGS. 6 and 7, the barrier extends the entire width of the cable housing. Since the connectors each have AC power, the shielding is configured to isolate the portion of each of the connectors 34 that transmits AC Power. The barrier 40 cooperates with a second barrier 42 which extends between each connector. The second barrier projects perpendicular from the back wall of the connector housing and is bent over again to form a contact surface 43 between the second barrier and the primary EMI barrier 40. A bead of EMI gasket material 44 is placed between the barriers 40 and 42 to complete the barrier. The connector 34 includes an EMI block which is described in more detail below.

Figure 8:
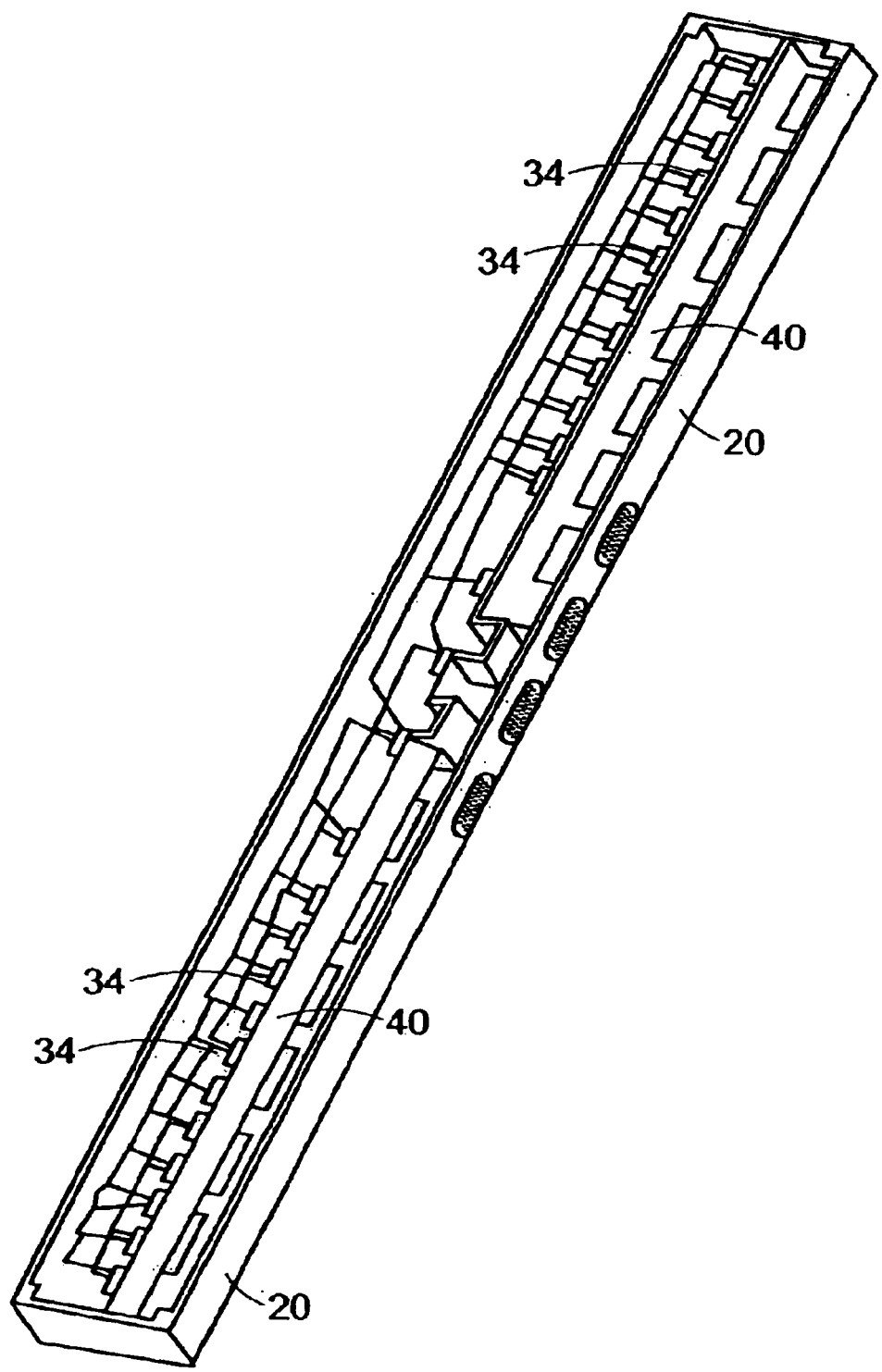
FIG. 8 is a view of the cable housing with the cover removed.

FIG. 8 shows a view of the cable housing 20 with the cover removed. The power connections are generally on the right side and the EMI shield 40 divides the power connection from the data connection. The lines on the left of the cable housing represent cables.

The Connector

Figures 9, 10:
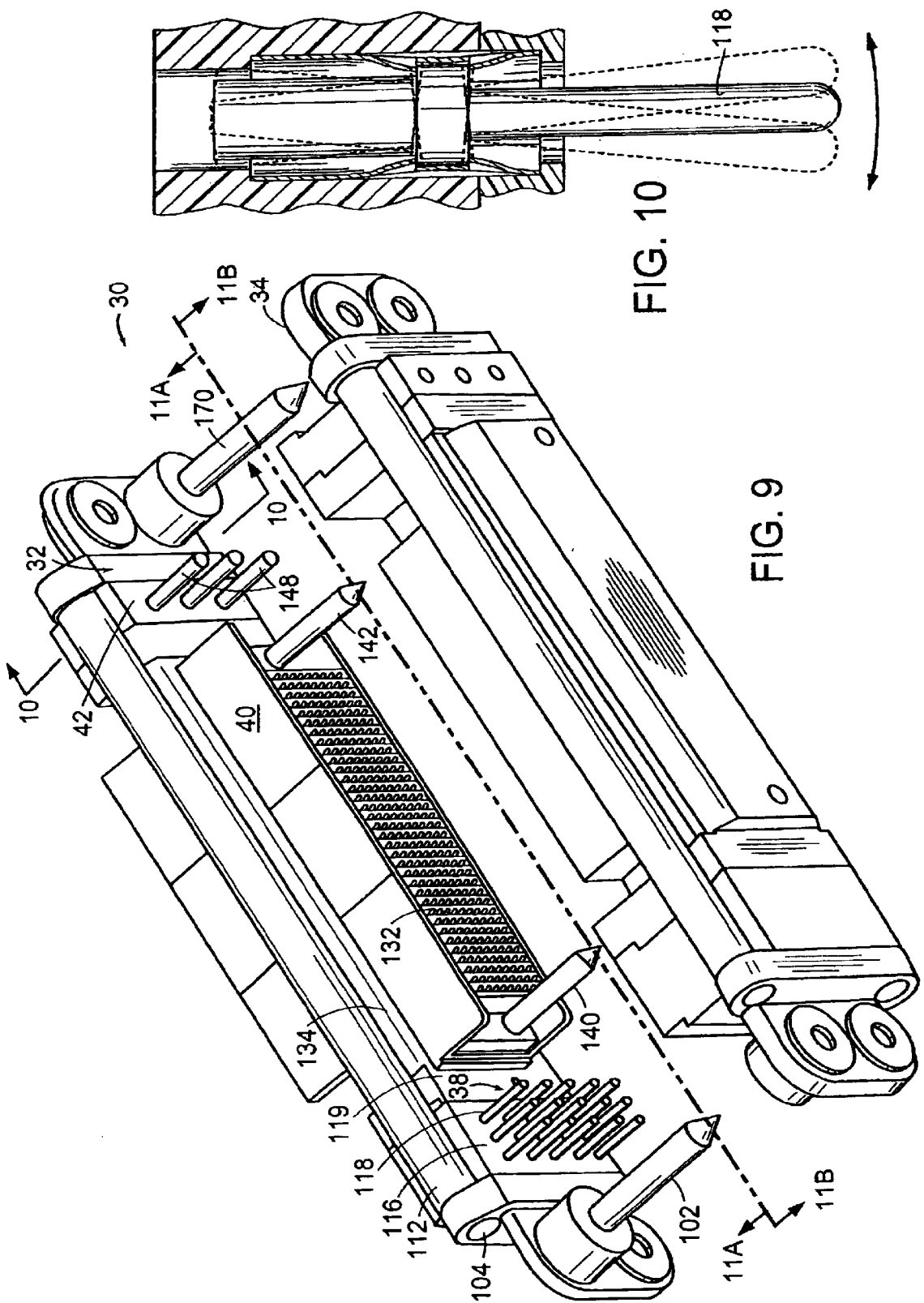
FIG. 9 is a perspective view of the connector showing the plug and socket disconnected.
FIG. 10 is a detail view of an individual pin showing its flexible mounting.

FIGS. 9–14 show the connector of the instant application. Referring principally to FIGS. 9 and 11A the connector 30 as shown includes the plug component 32 and the socket component 34 each of which are described in detail below. In general, the connector comprises 3 parts, a low speed data connection module 38, a high-speed data connection module 40, and an AC power module section 42.

A high speed data connection refers to the greater speed of two data connections. By way of example, a high speed data connection may be capable of transmitting data at greater than 15 MB/sec. Of course, this value will increase as technology permits. A low speed data connection refers to the slower of two data connections which may adapted to transmit data at less than 10 MB/sec, often slower speeds will be indicated. Of course, the speed at which data is transferred is largely due to the computer components and the connecting wire. The connector itself can be adapted to accommodate the transmission of data at greater and lesser speed.

Figure 11B:
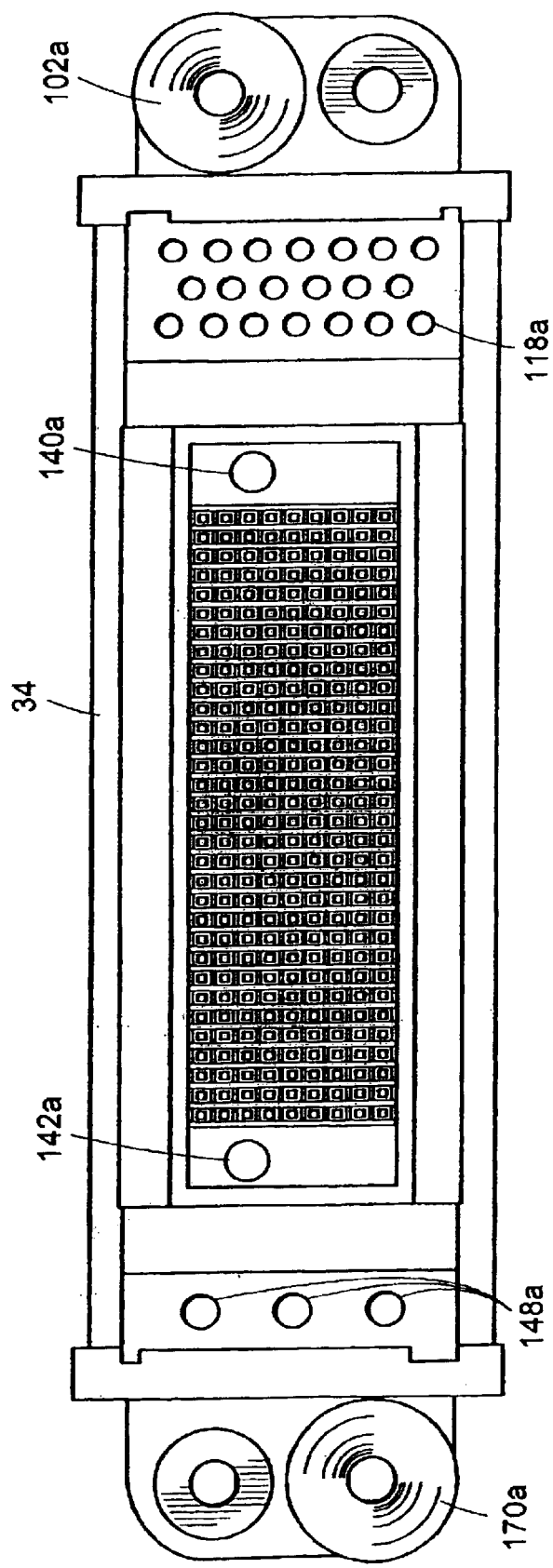
FIG. 11B is a face on view of the connector socket.

Each module is adapted to connect between the respective plug and socket 32 and 34 respectively. With particular reference to FIG. 11A, the plug 32 comprises an end cap 100 onto which alignment pin 102 is mounted. The alignment pin is oriented perpendicular to the flat surface of the end cap and has a tapered end. Adjacent to the alignment pin is a moveable bushing which serves as a mounting hole through which a screw can be fastened to removably mount the connector to one of the components 12, 14, or 16. The socket is shown in FIG. 11B, cooperating elements are listed with a suffice "a". For example, the pin 142 cooperates and fits within the socket 142a.

The end cap also has two flanges 104 and 106 which extend outwardly from the end cap. As shown in FIG. 11A, two holes are located in the flanges which accommodate screws 108 and 110. The screws are adapted to mount rails 112 and 114 to the end cap. As shown in particular FIG. 11C, the rails 112 and 114 are configured to have a U-shaped recess which face inward. Each of the connector modules 38, 40, and 42 are adapted to fit within the U-shaped recess as described more fully below. The low speed data module 38 is positioned against the end cap and is secured on the outboard side by the rails 112 and 114. Immediately adjacent to the low speed data module is a spacer 119 intended to separate the low speed data from the high-speed data pin array.

As described previously, the high-speed data module is adapted to move in the longitudinal and lateral directions as shown in directional indicator A in FIG. 11A. A narrow channel is disposed in the spacer 119 along the plane of the data plate into which the data plate 130 can be moveably positioned on each outboard side of the data plate a rail insert 134 is provided. As shown in FIG. 11D, the rail insert has an outwardly facing side which is adapted to conform to the inwardly facing U-shape 122 to be held in place. The inboard side of the rail insert has a narrow groove into which the data plate 130 is moveably positioned on the opposite side of the data plate is spacer 144. Spacer 144 also has a narrow groove, thus with the narrow grooves in spacers 119 and 144 and the rail inserts 134 and 136 the high-speed data plate is able to move in the longitudinal and lateral directions. As a preferred embodiment, the amount of movement that the plate is designed to accommodate is on the order of 0.025 inches in the X and Y directions. Of course, other tolerances may be used without departing from the scope of the invention. Along side the spacer 144 is the AC power module 42. The spacer 144 is intended to act as a shield to prevent the AC power from interfering with the data connections 40 and 38.

The spacer 144 cooperates with the EMI shield discussed previously to shield the data connections from AC power interference.

At the end of the rails 112 and 114 is end cap 160. Similar to end cap 100, end cap 160 has flanges on its outboard side with holes adapted to receive screws 166 and 168. The screws secure the end cap against the rails and thus the entire connector is constructed.

The end cap rail assembly provides an easy, modular approach. The process of assembling the plug portion of the connector includes screwing the rails into the end cap 100 and assembling the connector by sliding the individual connector modules into the rails separated by spacers. The screws on the end cap on the opposite side secure the end cap to the rails and provide the system with the needed integrity.

With reference to FIG. 10, the low speed data connection pins and the AC power pins are mounted in the module side with a certain amount of movement provided to accommodate slight misalignments during the mating process. The high-speed connection is not provided with moveable mountings as it is shown in this invention. The entire high-speed plate on to which the high-speed data pins are mounted is moveably mounted within the rails.

The socket 34 is constructed in much the same manner with end caps, that have flanges, that hold side rails. Each socket component is slideably positioned between the rails and secured by the end cap on the opposite side. Spacer elements are provided between the connection modules to allow for EMI shielding as well as comfortable spacing between the different components.

Thus the invention provides for a complete connection between the stackable processors in a single connection step. The surface area of the connector is compact, in the preferred embodiment, the connector has a surface area of less than 2.5 inches square. The use of AC power in the connection simplifies the components which would be necessary to include in the processors. Specifically, an DC to AC converter is not necessary.

Figure 12:
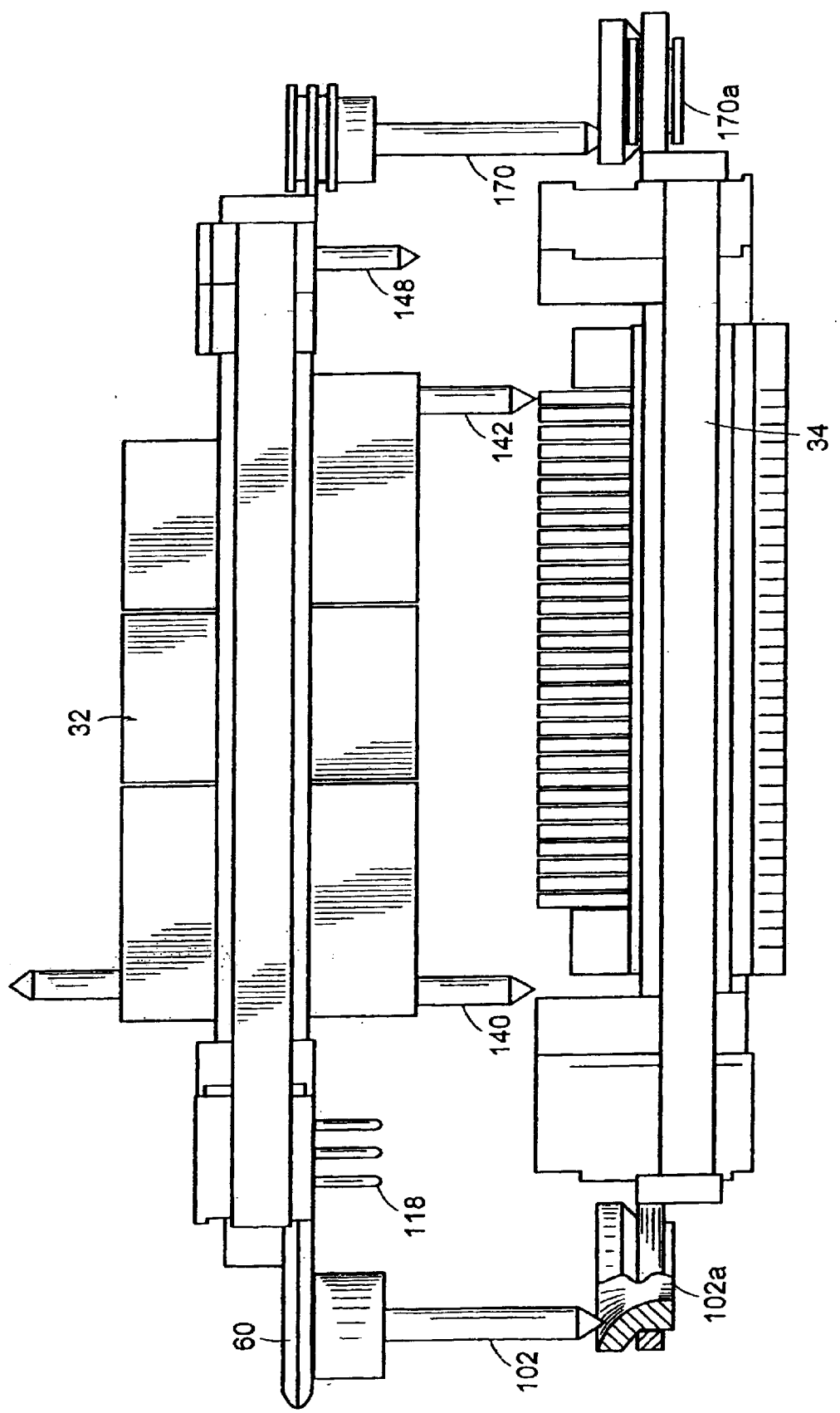
FIGS. 12 and 13 are side views of connector sequence showing staged connection of the plug and socket.
Figure 13:
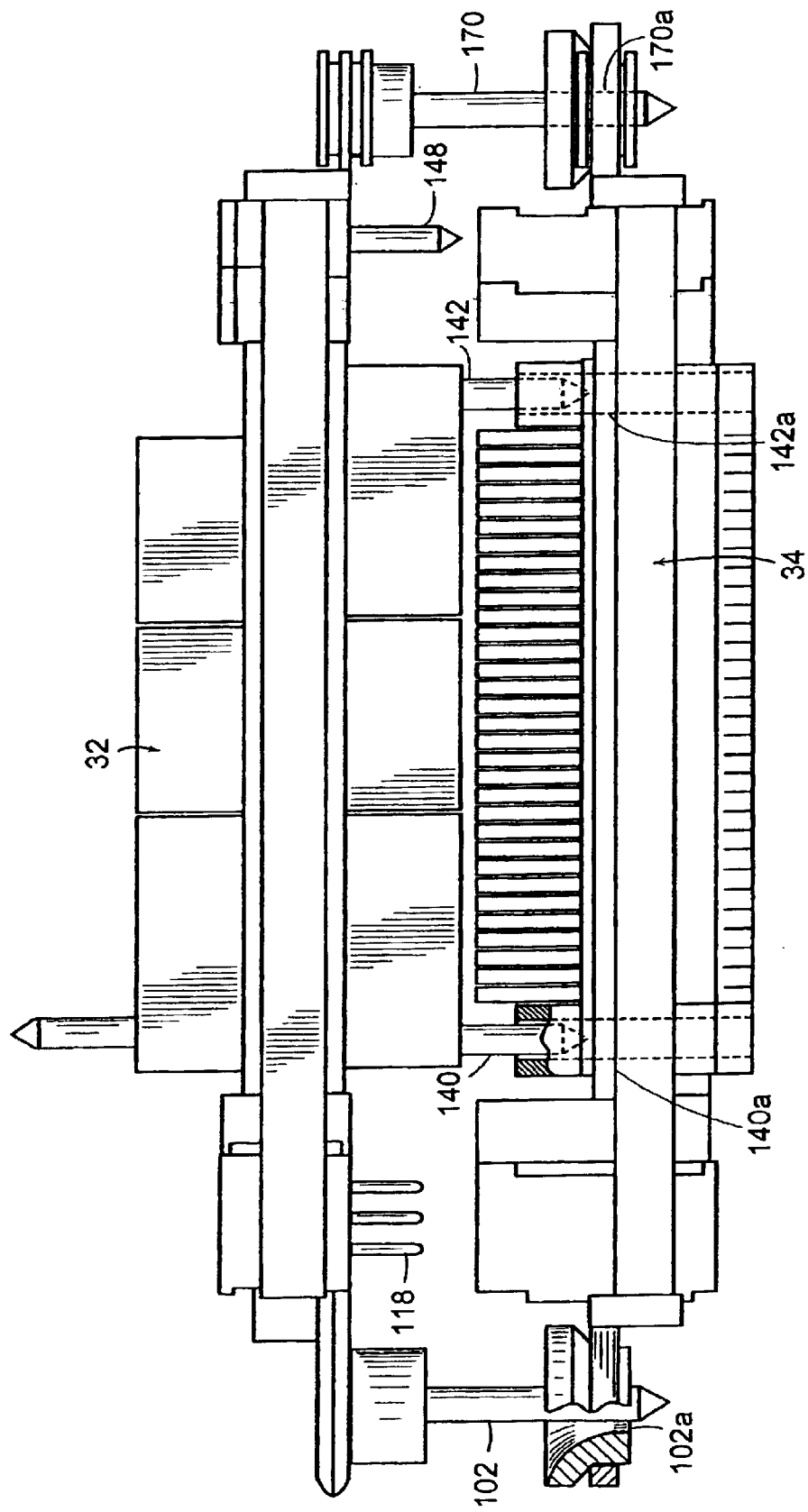
Figure 14:
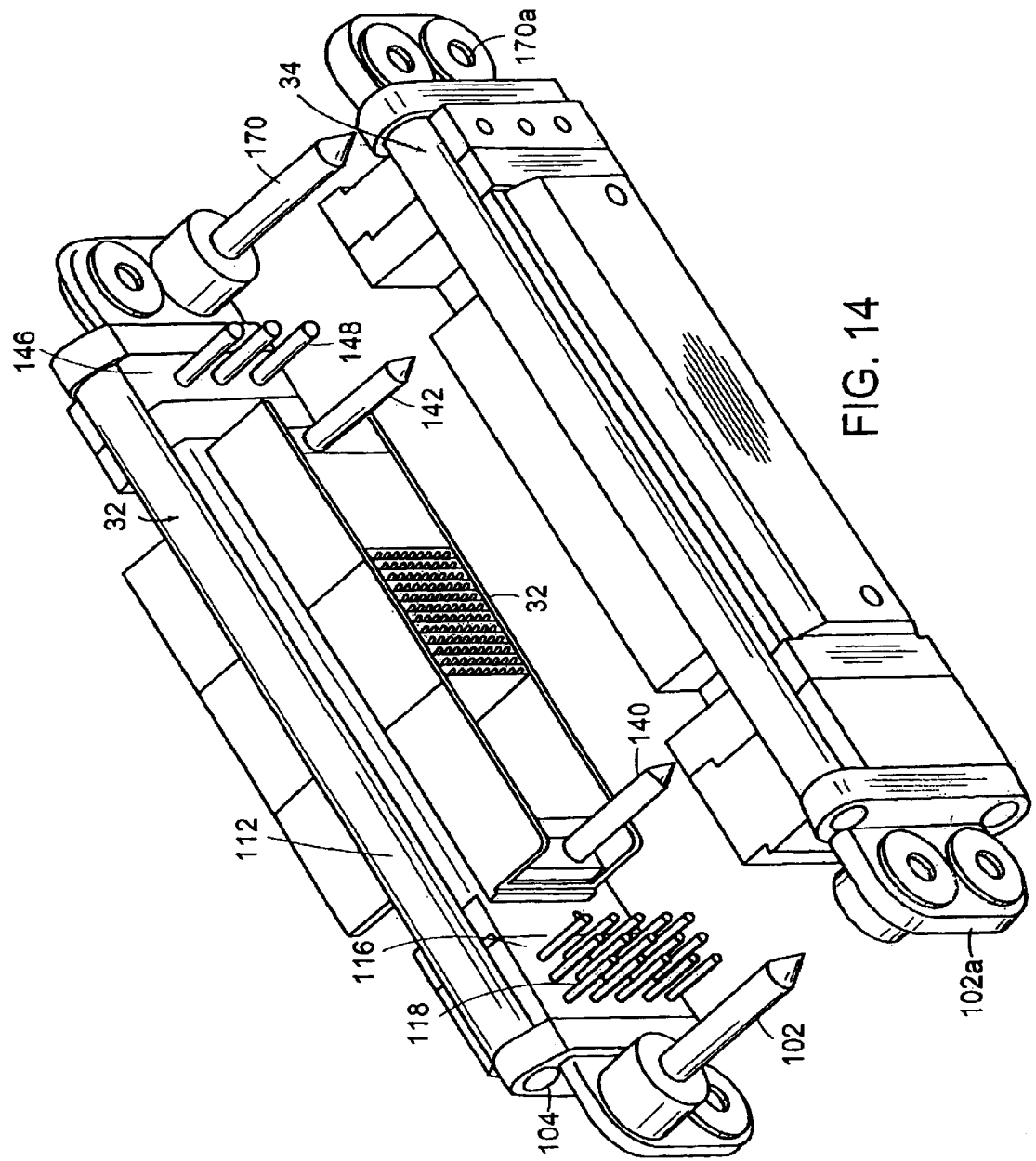
FIG. 14 is a connector adapted to connect signal processors to the spine.
Figure 15:
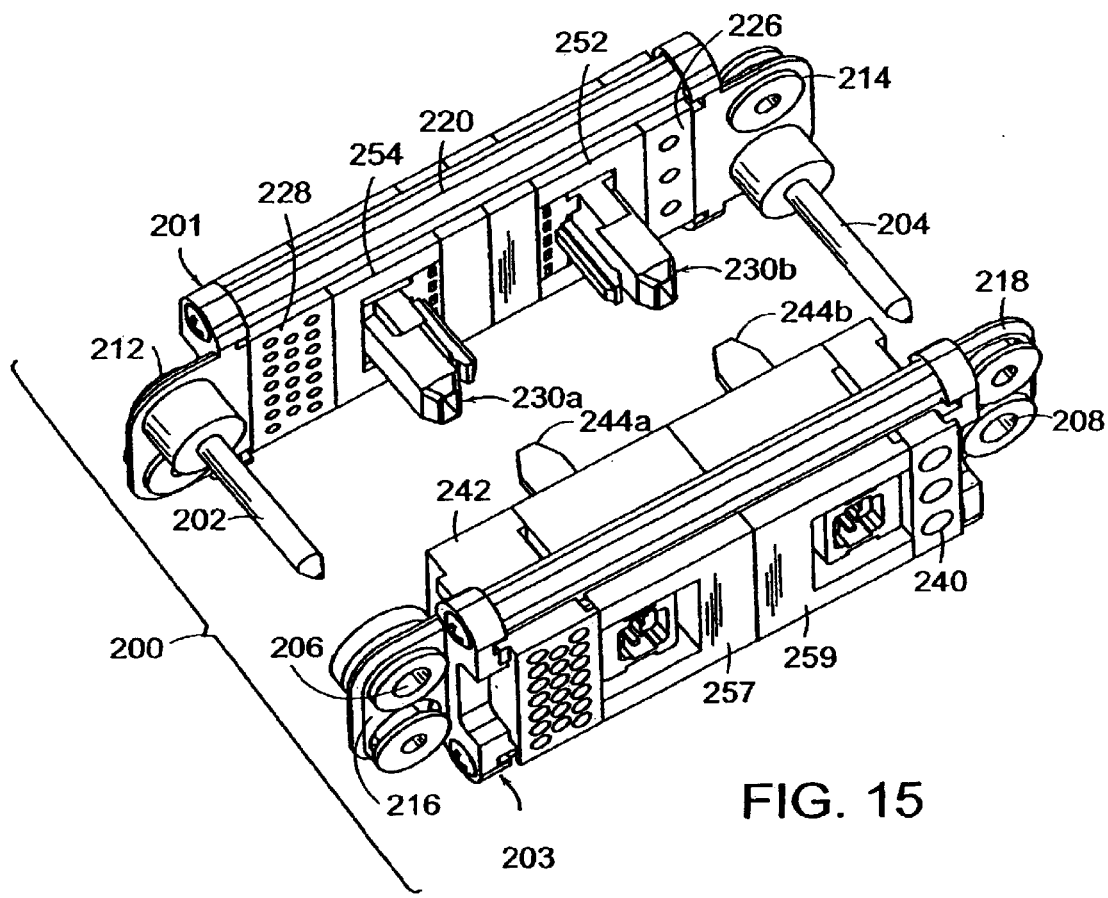
FIGS. 15–19 are illustrations of a connector according to another aspect of the invention; and, FIGS. 20–23 are exploded views of the connector illustrated in FIGS. 15–19.

The manner of connection will now be described with reference to FIGS. 12, 13, and 14. One feature of this invention is its multi-stage alignment which allows for a blind positioning of each of these connectors in a simple and reliable connection process. With specific reference to FIG. 12, the first stage of alignment and positioning occurs when the alignment pins 102 and 170 move and are positioned into a conical recess in the socket connector 102A and 170A, respectively. This allows for gross alignment of the interconnect system and once the alignment pins 102 and 170 are orientated in the funnel connector, the second stage alignment pins 140 and 142 are positioned just outside the openings 140A and 142A of the socket connector. As the second stage alignment pins 42 and 44 are positioned within the alignment sockets 42A and 44A, the high-speed date plate is able to move within the rails to orient the high-speed data plug to align properly with the high-speed data socket. The power connector plugs are then orientated against the power connection sockets and the low speed data plugs are orientated just outside the low speed data sockets. Thus when the second stage alignment pins are fully orientated within the alignment sockets 42A and 44A, the entire assembly is orientated properly so that a reliable connection can be made.

In some instances, it is not necessary to have a high speed connection that is the entire width of the device. For example, the processor modules 12 only require sufficient high speed connection to accommodate the design of the processor. Accordingly, the high speed connector may be constructed of a reduced width, as shown in FIG. 14. Since only the width of the high speed connector is modified, the same reference numerals refer to the same elements described earlier. It is significant to note that the reduced width high speed connector is centered between the power connection and the low speed data connection.

This contributes to a balancing of forces so that the plug can be placed in the socket reliably. When balanced, the connection process is smoother and less prone to mis-align during the insertion process. More specifically, the insertion forces associated with each of the different components are balanced along a longitudinal midline and the high speed data connection is balanced along that midline and each of the low speed data connection and the power connection are aligned and positioned based on insertion forces a certain distance from the midline. Thus the forces that are required to complete the insertion of the various plugs into the sockets is smooth and reliable and repeatable.

Another embodiment of the connector is described in connection with FIGS. 15–23. In this embodiment, the high-speed data connection has herein been replaced with a connection adapted for fiber optics. In this embodiment, the same staged connector is used whereby the connection is achieved by a series of pins which cooperate to align the connectors so that they are connected. This allows for the "blind" connection where a computer housing can be connected to a chassis without any visual alignment of the connector. As can be appreciated, the lack of a need for visual alignment greatly facilitates the interchangeability of the computer housings.

Figure 16:
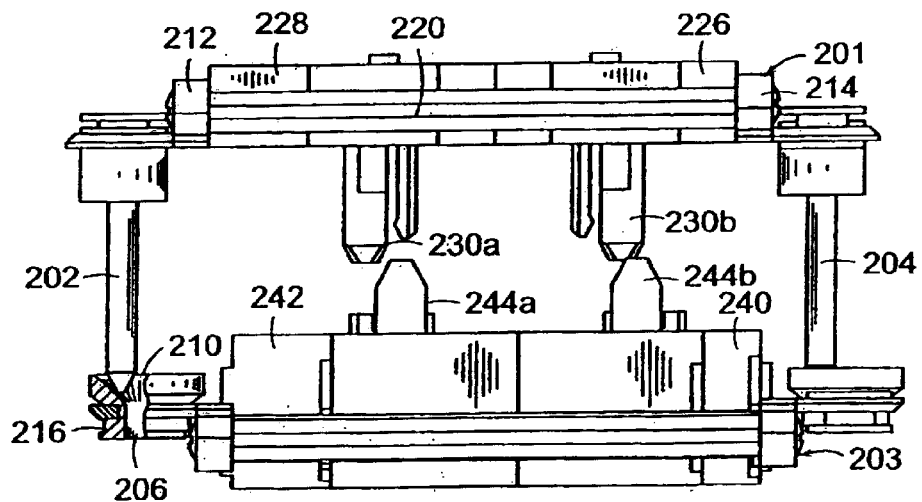

A connector 200 is shown in FIGS. 15–23. Many features of the connector 200 are similar to those previously described. The connector includes a plug 201 and a socket 203. Specifically, and with reference to the plug, the alignment pins 202, 204 in the plug are adapted to be inserted into the alignment holes 206, 208 in the socket. As illustrated in FIG. 16, the alignment holes 206 (and 208) have conical inside surfaces 210 which guide the alignment pins into the alignment hole. The conical inside surface of the hole 208 is not shown in FIG. 15.

The alignment pins 202, 204 are secured to end caps 212, 214 respectively. The alignment holes 206, 208 are formed in the end caps 216, 218 respectively. Along the edge of the end caps 212, 214, rails are adapted to be secured by screws. The rails 220, 222 and the end caps form the perimeter of the connector. The rail 222 is not within the view illustrated in FIG. 15.

As in the previously described embodiments, the rails and the end cap secure the components of the connector. Specifically, a power connector (in connection with the plug) 226, a low-speed data connector 228, and a high-speed data connector 230a, 230b are provided. High speed data connection components are available from Molex, Downers Grove, Ill. (www.Molex.com). The socket 203 also includes a power connector 240, a low speed data connection 242 and a high speed data connection 244a and 244b The pin connectors for the power and the low speed data connection are not illustrated in this embodiment. The high-speed data connection is a fiber optic connector. The connector provides several advantages.

First, as noted in the previous embodiment, the connector has a floating characteristic that allows the fiber optic connector to be "blindly" connected. That is, as the connector itself is being coupled, the fiber optic connector can align itself by moving slightly within the connector. This blind connection provides substantial advantages over the prior art in which multiple connections had to be visually aligned and manually connected. With the present invention, the connector is automatically aligned because of the way that the processor is adapted to fit within the chassis. The alignment is further achieved by the alignment pins and holes. Finally, for the high-speed data connection the alignment occurs because the plug and/or socket is able to float so that the parts are aligned.

A second advantage is that either the plug of the socket side maybe adapted to accommodate a fiber optic "jack" connection (e.g., phone jack). The connection at the back end means that the entire spine need not be wired when the chassis is assembled. Specifically, the connections can be located on the chassis and be held in reserve until they are needed. When they are needed, an operator can attach a fiber optic cable at the fiber optic "jack" connection. This can reduce the cost of the initial installation while maximizing the flexibility of the design so that when usage needs increase, the chassis may be conveniently be modified to accommodate the increased usage. Of course, this type of jack connection can be used in the embodiment described earlier.

The high-speed connector will be specifically described with reference to FIGS. 17–21. The plugs 230a and b are shown as similar, of course, the plugs could have a different configuration and still be within the scope of the invention. These particular fiber optic connections have an alignment tang 23a that rides along the outside of the socket 234a to ensure that the fiber optics are aligned. The tang serves to facilitate the floating alignment of the high-speed connection. As readily seen in a comparison between FIGS. 16 and 19, once the alignment pins are with the holes, the high speed data connection is aligned and the floating characteristic of high speed connector allows the connector to become aligned and connected.

Figure 17:
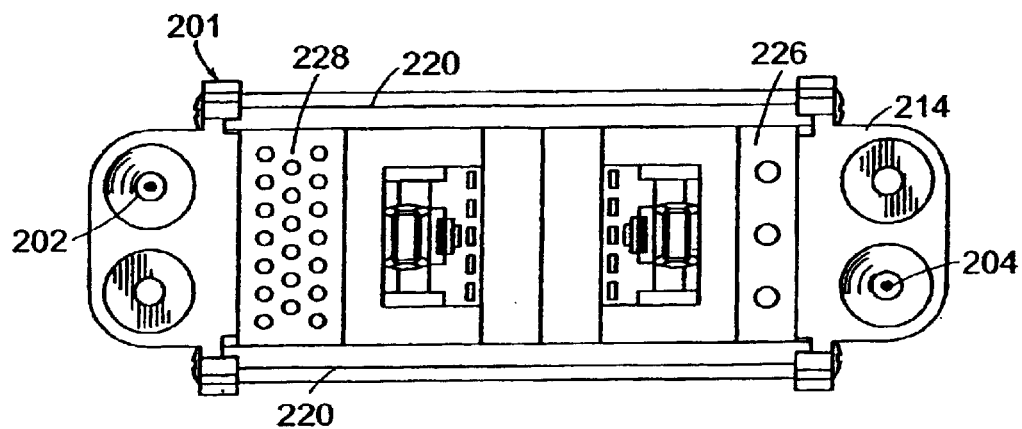
Figure 18:
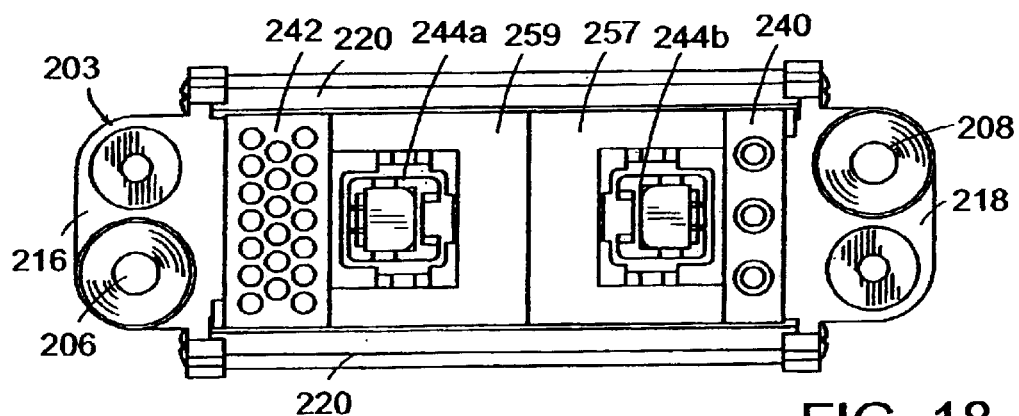
Figure 19:
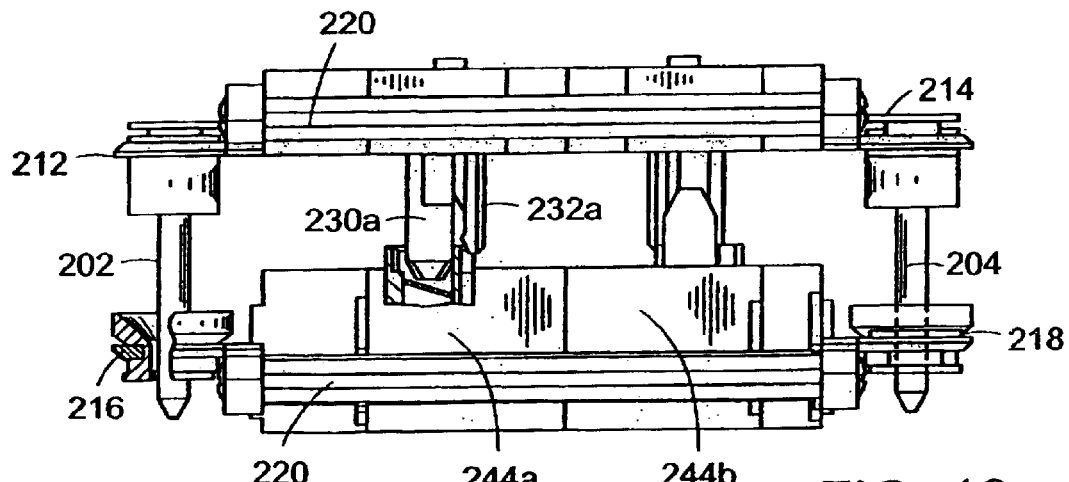

FIGS. 17 and 18 illustrate the connection side of the plug and socket, respectively. As readily apparent, the various connections are mounted with symmetry so that when the plug is placed within the socket, the connection that is formed is satisfactory to transfer the power and the data necessary for the processor to work in the chassis system.

Figure 20:
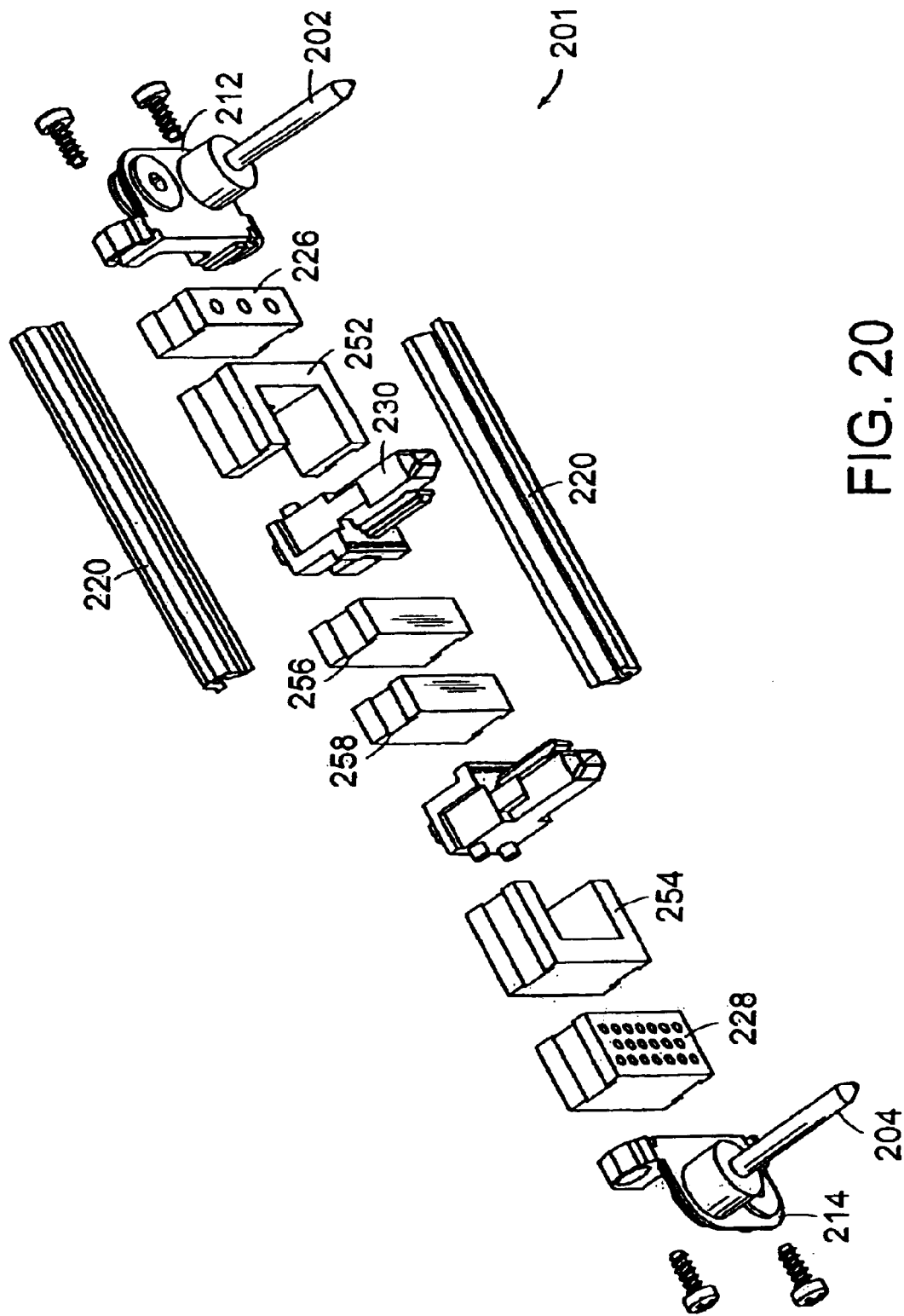
Figure 21:
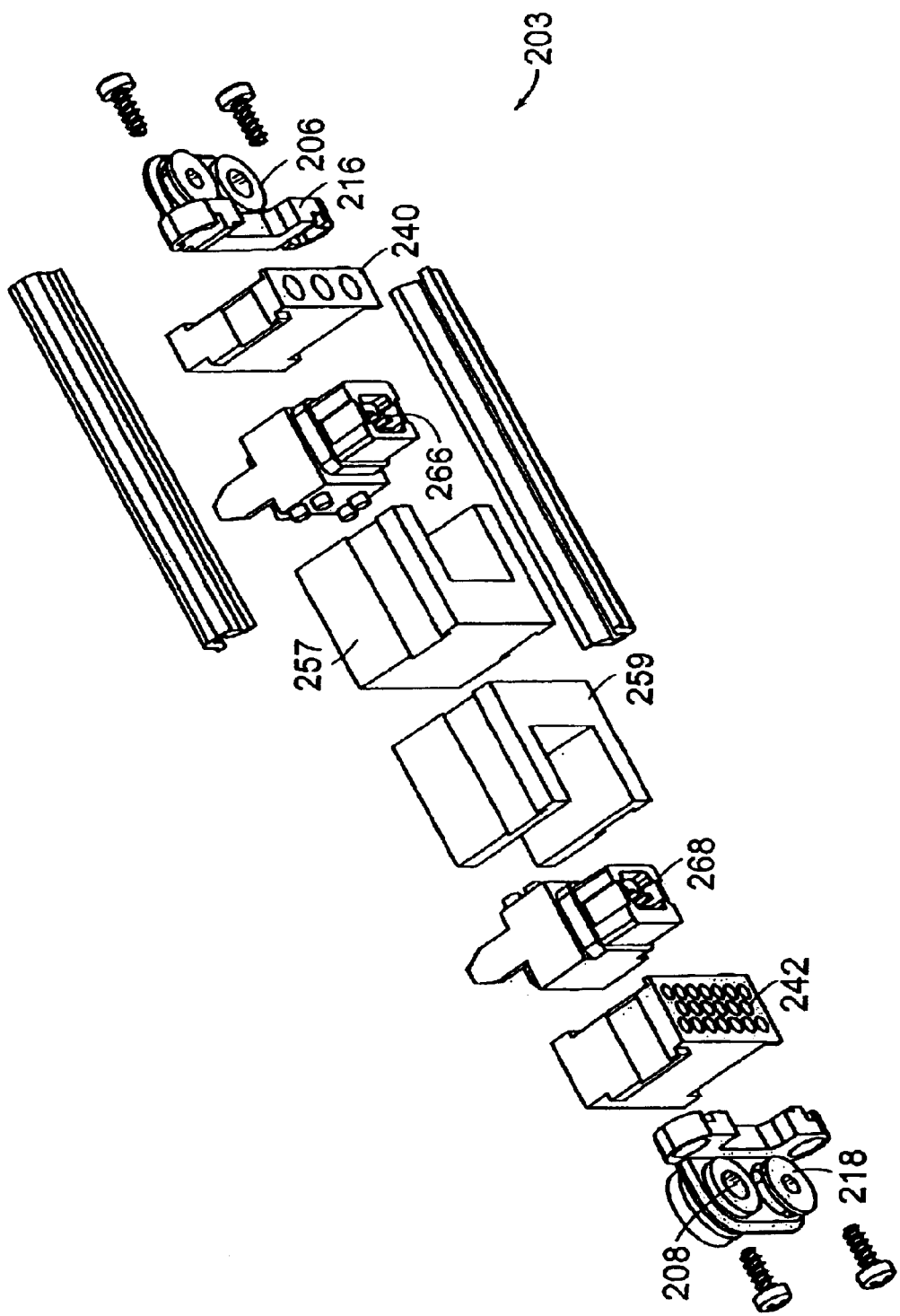
Figure 22:
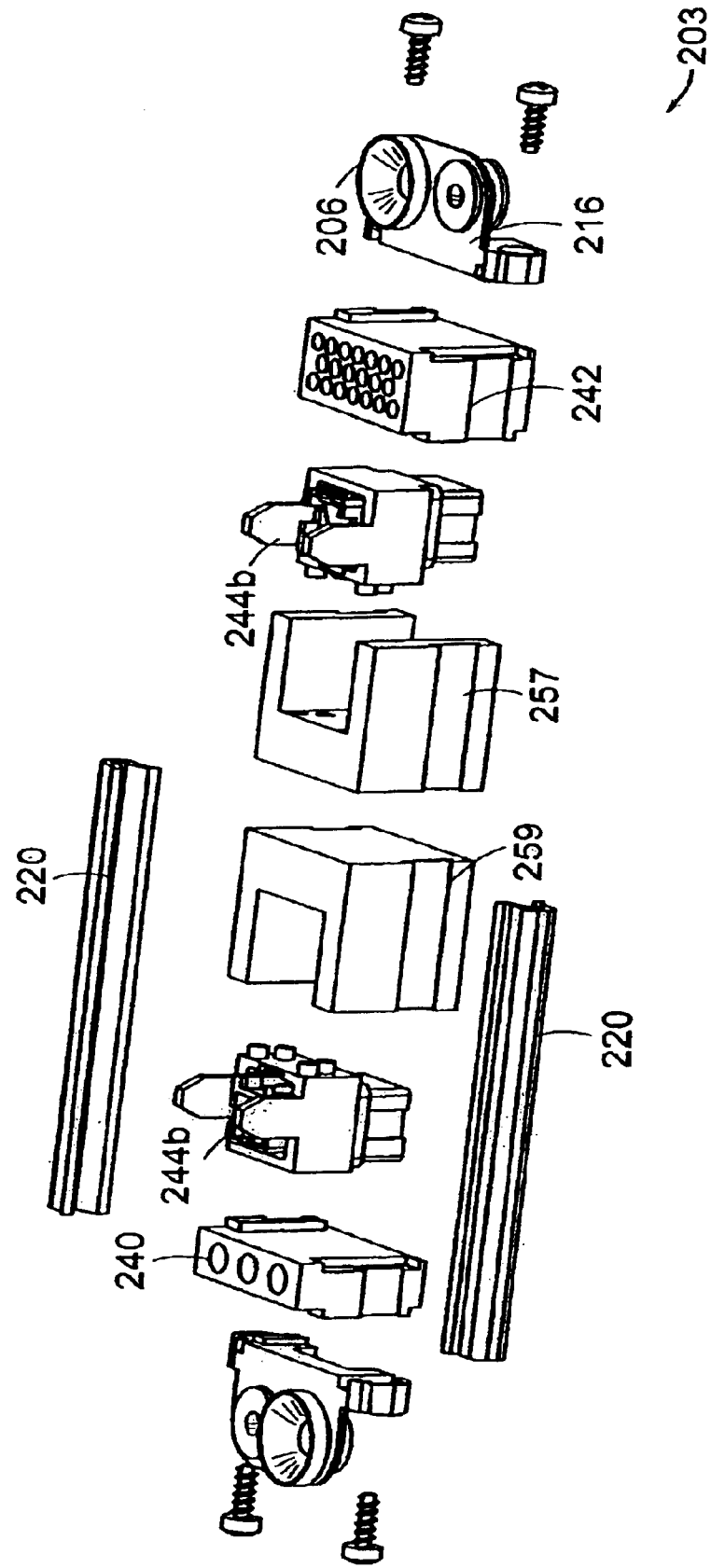
Figure 23:
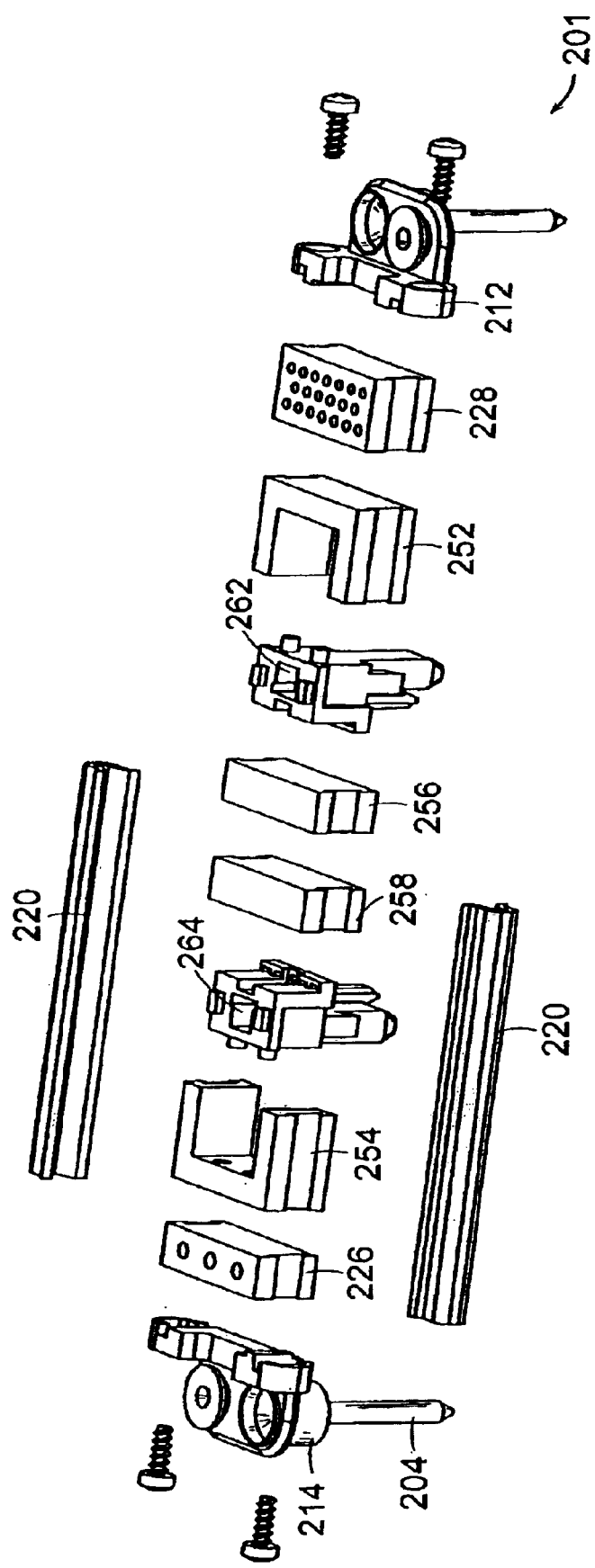

FIGS. 20–23 are exploded views of the connector illustrating the various components. Specifically, FIGS. 20 and 23 are the front and back of the plug component and FIGS. 21 and 22 are the front and back of the socket component.

Of note in these illustrations are spacers which are used to separate the plug and socket components. Specifically, generally U-shaped spacers 252, 254. The spacers can be any appropriate size to accommodate the high speed connector on the inside and be sized to be secured within the rails. The high speed connector may float within this U-shaped spacer and the spacer will secure the high speed connector within the rails structure. Other spacers 256, 258 may be added as desired to separate the various components. As illustrated in the socket, spacers 257 and 259 have a generally U-shape and are used to secure the high speed data connector to the rails. Additionally, as with the earlier described embodiment, the spacers may be used to isolate the data connections from any interference with the power connections. Interference between the power connection and the data connection could be significant if AC power is used. With this connector, AC power can be used with minimal interference to the data connections. Although the rails are shown with protrusions and the grooves are shown on the components, the alternative could be implemented. Additionally, the rails include extensions which fit within the grooves of the components so that the components will slide onto the rails. Once all the components are positioned on the rail, screws are used to secure the end caps to the rails and the connector is assembled.

FIG. 23 illustrates the back of the plug portion of the connector. Of note is the fiber optic "jack" connectors 262, 264 at the back end of the high speed plug connectors. The jack connection allows the plug connector to be installed (in either the chassis or the computer housing) and then be easily connected to other cables (whether wire or fiber optic cables). This provides a significant advantage for a connector of the present invention. The connector can be installed without being connected. If a connection is required, either immediately or at a later time, the cable connection is greatly facilitated. Of course any of the data or power components may be adapted to include the back facing socket for easy connection to other components. As illustrated in FIGS. 21, the back facing sockets are shown at 266 and 268.

While this invention has been described with reference to particular embodiments, other and different devices, including those obvious to those skilled in the art, will embody the invention are within the scope of the following claims.

What is claimed is:

1. A connector adapted to connect a processor to a chassis, the connector comprising:

a plug component including a high speed data section adapted to transfer data at a rate greater than 15 MB/Sec, a low speed data section adapted to transfer data at less than 10 MB/Sec, and a power section adapted to provide power to the processor, a socket component adapted to mate with the plug component and including a high speed data section, a low speed data section and a power section, wherein the high speed data section of the socket component is adapted to move relative to the power section to align the high speed data section of plug with the socket when the plug is connected to the socket; said connector further comprising a pair of rails onto which each section is placed, the high-speed data connector in a longitudinal center of the connector interface area.

2. A method of making a data and power connector adapted to transfer both data and power between plug and a socket, the method comprising:

assembling a power connector on a rail structure;

providing a data connector for data transmission;

assembling the data connector on the rail structure;

securing the rail structure so that the power connection and the data connector are securely held on the rail structure to form a plug;

forming a socket adapted to receive the plug by assembling a socket power connection on a second rail assembly and assembling a socket data connection to the second rail assembly and securing the socket power and socket data connections to the rail wherein one of data connection and data socket connection is adapted to float within the rail structure to facilitate alignment of the connection.

3. The method of claim 2 further comprising the step of assembling a high speed data connector on the rail in addition to the data connector.

* * * * *